United States Patent [19]
Tanaka et al.

[11] Patent Number: 5,357,193
[45] Date of Patent: Oct. 18, 1994

[54] SEMICONDUCTOR MEMORY HAVING A VOLTAGE STRESS APPLYING CIRCUIT

[75] Inventors: Hiroaki Tanaka, Yokohama; Masaru Koyanagi, Tokyo, both of Japan

[73] Assignee: Kabushiki Kaisha Toshiba, Kawasaki, Japan

[21] Appl. No.: 813,523

[22] Filed: Dec. 26, 1991

[30] Foreign Application Priority Data

Dec. 27, 1990 [JP] Japan ................... 2-418764

[51] Int. Cl.$^5$ .................. G01R 31/28; G11C 7/00
[52] U.S. Cl. ................... 324/158.1; 365/201; 371/21.1
[58] Field of Search ........... 324/158 R, 158 F, 158 T; 371/21.1, 21.4, 22.1, 22.3; 365/201

[56] References Cited

U.S. PATENT DOCUMENTS

| | | |
|---|---|---|
| 3,961,254 | 6/1976 | Cavaliere et al. ............. 371/22.3 |
| 4,336,495 | 6/1982 | Hapke ....................... 324/158 T |
| 4,339,710 | 7/1982 | Hapke ....................... 324/158 T |
| 4,357,703 | 11/1982 | Van Brunt .................. 324/158 T |
| 4,398,146 | 8/1983 | Draheim et al. ............ 324/158 T |
| 4,519,076 | 5/1985 | Priel et al. ................. 371/21.4 |
| 4,733,168 | 3/1988 | Blankenship et al. ....... 324/158 F |
| 4,743,841 | 5/1988 | Takeuchi .................... 324/158 T |
| 4,751,679 | 6/1988 | Dehganpour ................ 365/201 |
| 4,970,454 | 11/1990 | Stambaugh et al. ......... 324/158 R |
| 5,107,208 | 4/1992 | Lee .......................... 324/158 R |

FOREIGN PATENT DOCUMENTS

| | | |
|---|---|---|
| 0387379 | 9/1990 | European Pat. Off. . |
| 59-500840 | 5/1984 | Japan . |
| 60-235455 | 11/1985 | Japan . |
| 82/00896 | 3/1982 | PCT Int'l Appl. . |
| 82/00917 | 3/1982 | PCT Int'l Appl. . |

OTHER PUBLICATIONS

"Fast Method Used To Stress and Test Memory Arrays", IBM Technical Disclosure Bulletin, vol. 29, No. 12, May 1987, Armonk, N.Y., pp. 5534–5535.

*Primary Examiner*—Ernest F. Karlsen
*Attorney, Agent, or Firm*—Banner, Birch, McKie & Beckett

[57] ABSTRACT

An semiconductor device includes an integrated circuit having first and second circuit sections formed on a semiconductor chip, at least one voltage stress testing pad formed on the semiconductor chip for supplying a voltage stress testing voltage or signal to the first circuit section, and a control circuit formed on the semiconductor chip for controlling and setting the second circuit section into a state corresponding to a voltage stress testing mode by using an input from the voltage stress testing pads.

10 Claims, 3 Drawing Sheets

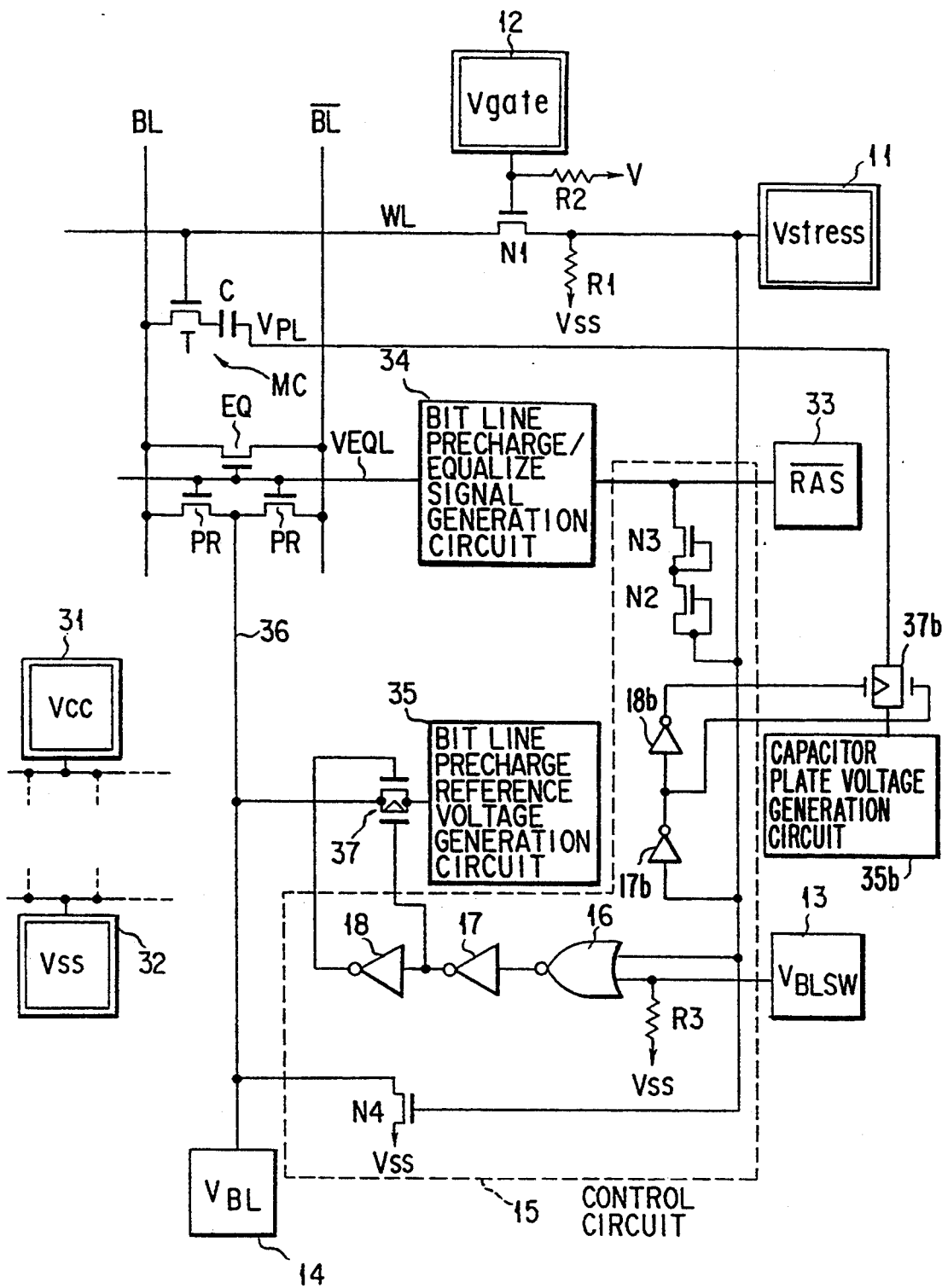
F I G. 1

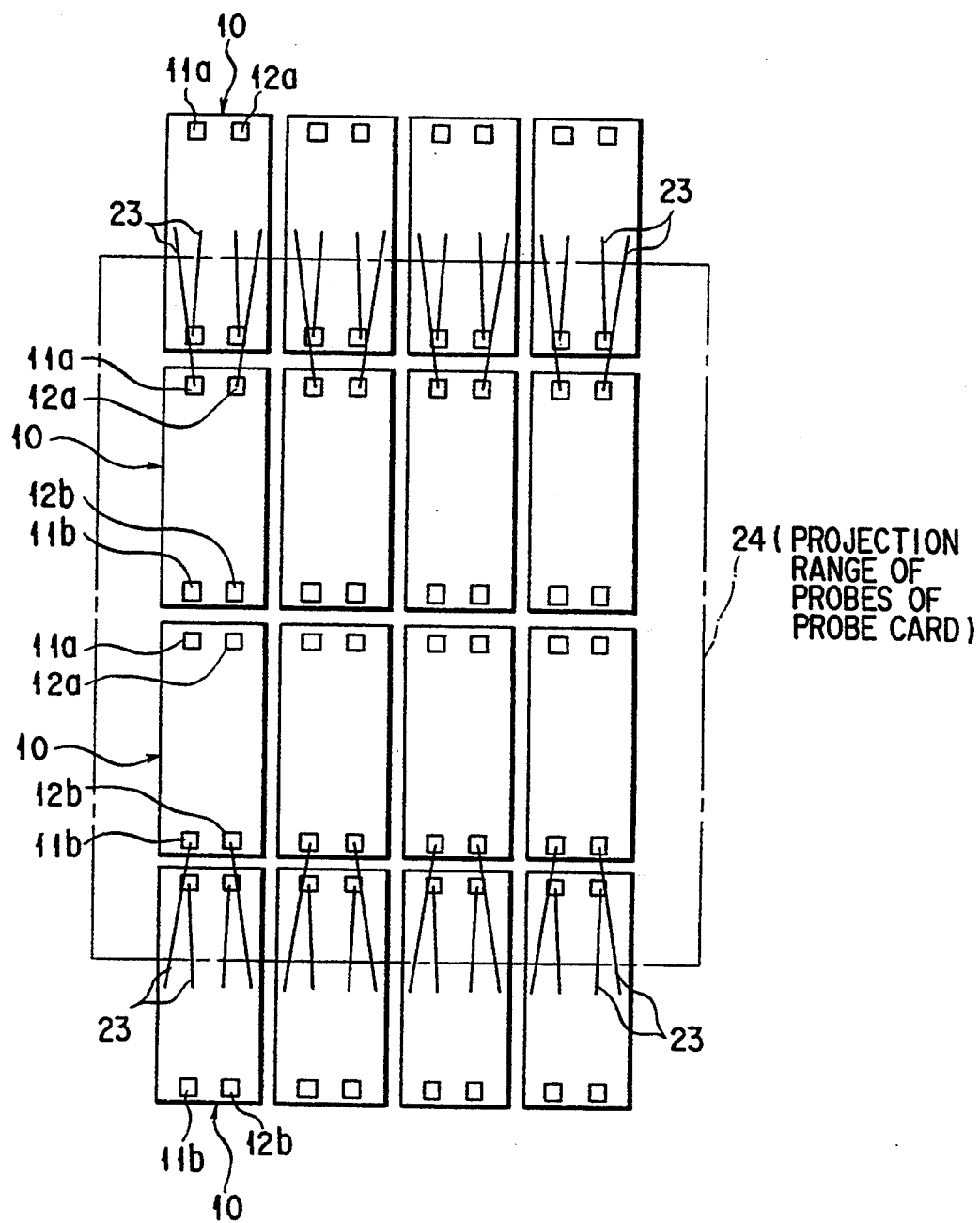
F I G. 2

SEMICONDUCTOR MEMORY HAVING A VOLTAGE STRESS APPLYING CIRCUIT

BACKGROUND OF THE INVENTION

1. Field of the Invention

This invention relates to a semiconductor device, and more particularly to a semiconductor device having voltage stress testing pads for effecting a screening test to eliminate defective elements by use of a probe card and a prober in a state (wafer state) in which the semiconductor wafer is not yet divided into chips.

2. Description of the Related Art

In general, in a semiconductor device manufacturing process, non-defective elements are selected by the die sort test after completion of the wafer manufacturing process, defective elements are marked and then the non-defective elements are set into packages to make finished products. The semiconductor device in the form of a finished product (after the packaging operation) is subjected to a burn-in process.

A semiconductor memory (which is suitable for a method of effecting the screening test to eliminate defective elements by use of a probe card and a prober in the wafer state before the die sorting operation is used) is proposed in U.S. patent application Ser. No. 07/544,614, now abandoned.

According to the above semiconductor memory, when the screening test is effected by use of the probe card and prober in the wafer state, the screening test for the individual memory chip areas can be efficiently effected in a short period of time.

When the probes of the probe card are simultaneously set in contact with voltage stress testing pads on a plurality of chip areas of the wafer to apply the voltage stress in the screening operation in the wafer state, the following problems may occur if the number of voltage stress testing pads for each chip is large.

(a) When there does not exist a sufficiently large space for arranging pads on the chip, the chip size must be increased if the voltage stress testing pads are to be added.

(b) When the number of probes of the probe card is increased according to the number of pads, it becomes difficult to attain the good flat contact between the front end of the probe and the pad. When the front end of the probe of the probe card cannot be made sufficiently flat, the pad and the probe of the probe card may be damaged and the durability of the probe will be degraded.

(c) When the number of probes of the probe card is increased according to the number of pads, it becomes necessary to significantly enhance the voltage supplying ability of a tester connected to the probe card, thereby raising the cost of the tester.

(d) When the distance between the pads is smaller than the minimum pitch of the probes of the probe card, the number of chips which can be simultaneously set in contact with the probes of the probe card is limited.

(e) The limitation on the arrangement of pads becomes severe and it becomes difficult to arrange the pads in such a pattern that a large number of chips can be simultaneously subjected to the screening test in the wafer state.

Therefore, in a semiconductor device having voltage stress testing pads for effecting the screening test to eliminate defective elements in the wafer state, it is desirable to reduce the number of voltage stress testing pads for each chip.

SUMMARY OF THE INVENTION

This invention has been made in view of the above problems and an object of this invention is to provide a semiconductor device in which the number of voltage stress testing pads (for each chip) which are formed on the chip and set into contact with probes of a probe card in the screening operation for eliminating defective elements in the wafer state can be reduced, an increase in the chip size can be prevented, damages on the pads and the probes of the probe card can be prevented, the durability of the probe of the probe card can be improved, the efficiency of the screening test for eliminating defective elements is enhanced, the production capacity can be increased and the manufacturing cost can be reduced.

In order to attain the above object, a semiconductor device of this invention comprises an integrated circuit including first and second circuit sections formed on a semiconductor chip; at least one voltage stress testing pad formed on the semiconductor chip, for supplying a voltage stress testing voltage or signal to the first circuit section; and a control circuit formed on the semiconductor chip, for controlling and setting the second circuit section into a state corresponding to a voltage stress testing mode by using an input from the voltage stress testing pads.

In the above semiconductor device, when the screening test for eliminating defective elements is effected in the wafer state by simultaneously setting the probes of the probe card in contact with the voltage stress testing pads of a plurality of chip areas of the wafer to apply a voltage stress to them, not only the first circuit section but also the second circuit section can be set into a voltage stress testing mode by use of an input from one voltage stress testing pad.

Therefore, it becomes unnecessary to form a voltage stress testing pad for the second circuit section and it becomes possible to reduce the number of voltage stress testing pads for each chip which are set in contact with the probes of the probe card in the screening operation for eliminating defective elements in the wafer state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing part of a dynamic random access memory (DRAM) according to a first embodiment of this invention;

FIG. 2 is a diagram showing the condition in which the probes of the probe card are set in contact with the voltage stress testing pads of the DRAM chip when the DRAM of FIG. 1 is subjected to the burn-in process in the wafer state.

DETAILED DESCRIPTION OF THE PREFERRED EMBODIMENTS

Figure 3:
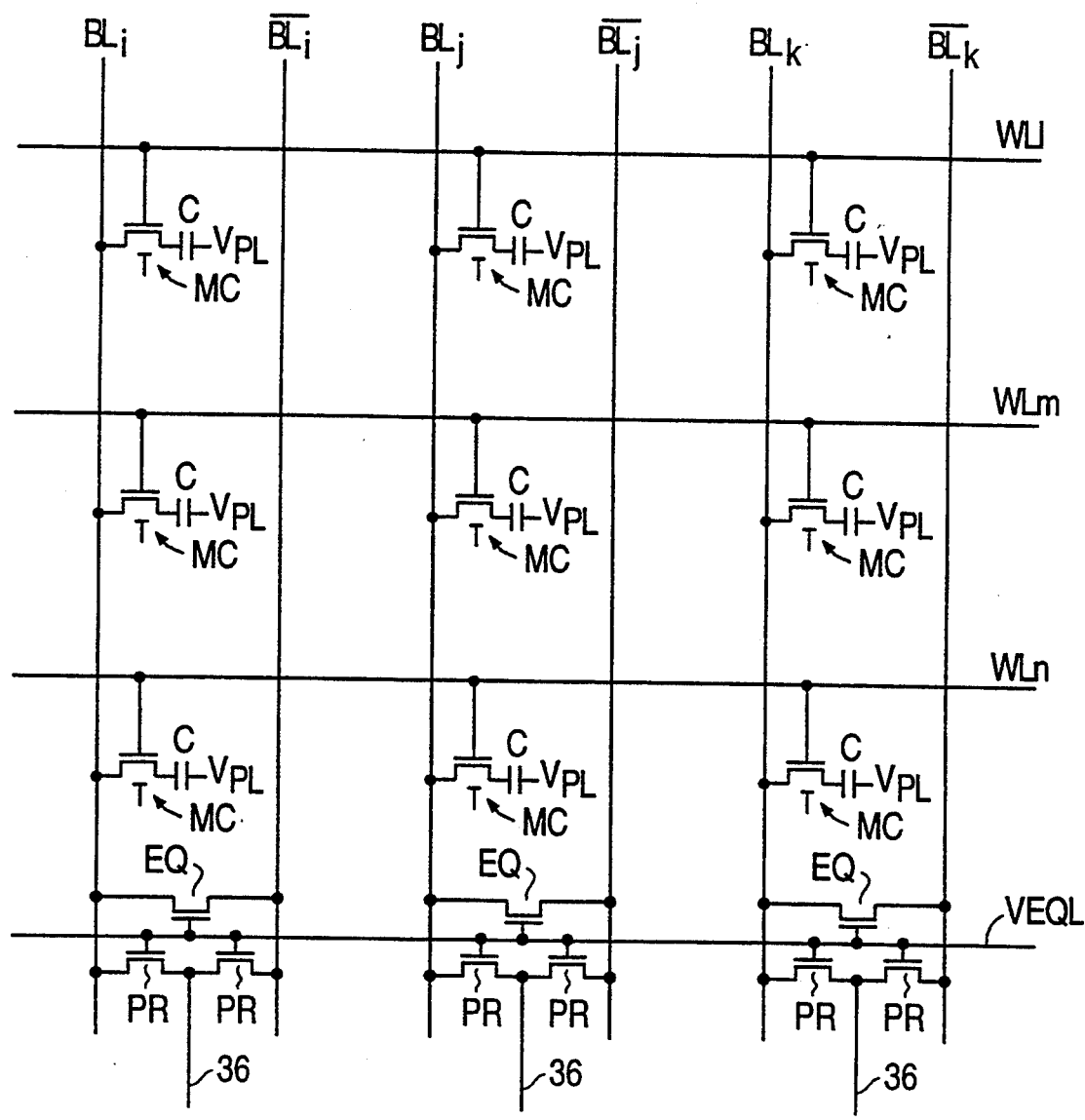
FIG. 3 is a circuit diagram showing a portion of a memory cell array.

There will now be described embodiments of this invention with reference to the accompanying drawings. In the accompanying drawings, the same portions are denoted by the same reference numerals and the repetitive explanation for the same portions is omitted.

FIG. 1 shows selected portions of pads and selected portions of a DRAM circuit formed on a DRAM chip according to a first embodiment of a semiconductor device of this invention.

The DRAM chip area is so constructed as to improve the efficiency of application of the voltage stress and the construction thereof is explained below.

In FIG. 1, 31 denotes a power source potential $V_{CC}$ supplying pad and 32 denotes a ground potential $V_{SS}$ supplying pad. One of word lines WL of the memory cell array, one of of bit line pairs (BL,/BL), one of one-transistor/one-capacitor type dynamic memory cells MC, one of bit line precharge circuits PR and one of bit line equalize circuits EQ connected to respective columns of the memory cell array are shown as representatives in FIG. 1. FIG. 3 shows a portion of a memory cell array containing the dynamic memory cells conventionally organized in rows and columns.

33 denotes a RAS pad to which a row address strobe (/RAS) signal is supplied.

34 denotes a bit line precharge/equalize signal generation circuit for receiving a/RAS signal from the RAS pad 33 and supplying a bit line precharge/equalize signal $V_{EQL}$ to the bit line precharge circuit PR and the bit line equalize circuit EQ.

35 denotes a bit line precharge voltage generation circuit for supplying a bit line precharge voltage (which is normally set at $V_{CC}/2$) to the bit line precharge circuit PR via a bit line precharge power source line 36.

37 denotes a bit line precharge output switching circuit (for example, CMOS transfer gate) which is connected between the output node of the bit line precharge voltage generation circuit 35 and the bit line precharge power source line 36.

Further, in order to enhance the efficiency of application of the voltage stress to the DRAM circuit, a first pad 11, second pad 12 and control circuit 15 are provided. A pull-down resistor R1 is connected between the first pad 11 and the ground potential ($V_{SS}$) node and a pull-down resistor R2 is connected between the second pad 12 and the $V_{SS}$ node.

The first pad 11 and the second pad 12 are connected to a first circuit section for applying a voltage stress to the DRAM circuit. In this embodiment, the first pad 11 is connected to a first side of the ends of the word lines WL via corresponding switching circuits (for example, NMOS transistors) N1 and is applied with a stress voltage $V_{stress}$ from the exterior in the voltage stress testing operation. Further, the second pad 12 is connected to the gate of the NMOS transistor N1 and is applied with a gate control voltage $V_{gate}$ from the exterior in the voltage stress testing operation.

In order to permit the voltage stress to be simultaneously applied to all of the word lines (or word lines of a number equal to or larger than the number of word lines selected in the normal operation) at the time of application of the voltage stress, the first pad 11 is commonly connected to first sides of the ends of all (or selected ones) of the NMOS switching circuits N1 and the second pads 12 is commonly connected to the gates of all (or selected ones) of the NMOS switching circuits N1.

The control circuit 15 is constructed to control and set the second circuit section of the DRAM circuit into a state corresponding to the voltage stress testing mode according to an input from a desired one (for example, first pad 11) of the voltage stress testing pads (in other words, it is constructed to control the output potential of the bit line precharge/equalize signal generation circuit 34, the switching state of the bit line precharge voltage output switching circuit 37 and the potential of the bit line precharge power source line 36).

In the control circuit 15, two NMOS transistors N2 and N3 whose drains and gates are respectively connected to each other are serially connected between the first pad 11 and the input node of the bit line precharge/equalize signal generation circuit 34. The first pad 11 is connected to a first input terminal of a 2-input NOR circuit 16 and a pull-down resistor R3 is connected between the second input terminal of the NOR circuit 16 and the $V_{SS}$ node. The output terminal of the NOR circuit 16 is connected to two stages of inverters 17 and 18 and outputs (complementary signals) of the two inverter stages are used to control the bit line precharge output switching circuit 37. An NMOS transistor N4 is connected between the bit line precharge power source line 36 and the $V_{SS}$ node and the gate thereof is connected to the first pad 11.

The second circuit section controlled by the control circuit 15 may be connected to a pad which is used at the time of die sort if necessary. In this embodiment, a third pad 13 is connected to the second input terminal of the NOR circuit 16 and the resistor R3, and a fourth pad 14 is connected to the bit line precharge power source line 36.

Next, a method of effecting the screening operation to eliminate defective elements when the DRAM of FIG. 1 is in the wafer state is explained.

A desired stress voltage $V_{stress}$ (for example, a normal word line voltage raising potential) is applied to the first pad 11 from the exterior and a gate control voltage $V_{gate}$ equal to or higher than ($V_{stress}+V_{th1}$) ($V_{th1}$ is the threshold voltage of the NMOS transistor N1) is applied to the second pad 12. As a result, the NMOS transistor N1 is turned on so as to permit the voltage stress to be applied to all of the word lines WL from the first pad 11.

At this time, the bit line equalize/precharge signal generation circuit 34 is supplied with a potential ("H" level) of ($V_{stress}-V_{th2}-V_{th3}$) ($V_{th2}$ is the threshold voltage of the NMOS transistor N2 and $V_{th3}$ is the threshold voltage of the NMOS transistor N3) from the first pad 11. This state is the same as the state which is set when a/RAS signal of the RAS pad 33 is set in the non-active state ("H" level), and the circuit 34 is activated to generate the bit line precharge/equalize signal $V_{EQL}$. As a result, the bit line precharge circuit PR and the bit line equalize circuit EQ are both set in the ON state, thereby applying the potential of the bit line precharge power source line 36 to all of the bit line pairs (BL, /BL).

At this time, since the same state as that which is set when the/RAS signal is set in the non-active state ("H" level) is set, the DRAM circuit is set into the standby state and word line driving transistors (not shown) are set in the non-selected state for all of the word lines WL.

Further, the NOR circuit 16 supplies an output of "L" level when receiving the stress voltage $V_{stress}$ ("H" level) applied to the first pad 11, and the bit line precharge output switching circuit 37 is set into the OFF state by the outputs of the inverters 17 and 18.

The NMOS transistor N4 is set into the ON state by the stress voltage $V_{stress}$ ("H" level) applied to the first pad 11 and the potentials of all of the bit line pairs (BL,/BL) are set to the ground potential $V_{SS}$. As a result, a voltage stress of ($V_{stress}-0$ V) can be applied to the gate insulation film of the transfer gate NMOS transistor T of the memory cell MC.

The reason why the voltage stress is applied to the gate insulation film of the transfer gate NMOS transistor T of the memory cell MC is that it is particularly desirable to effect the screening test for eliminating defective elements in this circuit part since the word line WL selected at the time of normal operation has applied to it a word line voltage having a higher potential resulting in a more intense electric field being applied to a gate insulation film of this circuit than that applied to other circuits.

In a normal operation, other than the voltage stress test, the first pad 11 and the second pad 12 are pulled down to the ground potential $V_{SS}$ via the pull-down resistors R1 and R2. As a result, the NMOS transistor N1 is turned off. At this time, since the NMOS transistors N2 and N3 are not turned on if a voltage in an operative voltage range (or negative voltage) is applied to the RAS pad 33, the first pad 11 and the RAS pad 33 are electrically disconnected.

Further, in the normal operation (other than the voltage stress test), since the third pad 13 is pulled down to the ground potential $V_{SS}$ via the pull-down resistor R3, the two inputs of the NOR circuit 16 are both set at the "L" level, the output of the NOR circuit 16 is set to the "H" level, and the bit line precharge output switching circuit 37 is set into the ON state by the outputs of the inverters 17 and 18. At this time, the NMOS transistor N4 is set into the OFF state by the "L" level from the first pad 11.

As a result, in the normal operation (other than the voltage stress test), an output potential of the bit line precharge voltage generation circuit 35 is transmitted to the bit line precharge power source line 36.

According to the DRAM of FIG. 1, in the process of effecting the burn-in in the wafer state, it is not necessary to set the probes of the probe card in contact with the RAS pad 33, third pad 13 and fourth pad 14. In other words, it is only necessary to use four voltage stress testing pads ($V_{CC}$ pad 31, $V_{SS}$ pad 32, first pad 11 and second pad 12) with which the probes of the probe card are set into contact.

The power source pad 31, ground pad 32 and RAS pad 33 are also used to effect the function test for evaluating the characteristic of the DRAM circuit in the die sorting process and are electrically connected to external pins via bonding wires, for example, when the semiconductor device held in the wafer state is divided into DRAM chips which are in turn set into packages and formed as finished products (DRAM devices).

Further, the third pad 13 and fourth pad 14 can be used when the function test for evaluating the characteristic of the DRAM circuit is effected in the die sorting process. That is, it is possible to set the bit line precharge output switching circuit 37 into the OFF state by applying the "H" level potential to the third pad 13 from the exterior and change the precharge voltage of the bit line by applying a desired bit line voltage to the fourth pad 14 from the exterior.

In the above embodiment, the two NMOS transistors N2 and N3 are serially connected between the first pad 11 and the input node of the bit line precharge/equalize signal generation circuit 34, but the control circuit 15 may be modified so as to connect the first pad 11 directly to the bit line precharge/equalize signal generation circuit 34. In this case, the control circuit 15 effects the control operation such that the output of the bit line precharge/equalize signal generation circuit 34 may be activated when the stress voltage $V_{stress}$ is applied to the first pad 11 and the bit line precharge/equalize signal generation circuit 34 may effect the normal operation when the first pad 11 is set at the "L" level.

Further, the control circuit 15 sets the output switch 37 of the bit line precharge voltage generation circuit 35 by use of the input from the first pad 11 and controls and sets the potential of the bit line precharge power source line 36 to the ground potential $V_{SS}$, but when the bit line precharge voltage generation circuit 35 includes an output potential switching circuit, the control circuit 15 may be designed to control the output potential switching circuit by use of the input from the first pad 11.

The control circuit 15 may be connected to indirectly receive the input of the pad 11 via an element.

Further, like the control for the bit line precharge voltage generation circuit 35, the control circuit 15 may effect the control operation for the output switch 37b (or output potential) of a memory cell capacitor plate voltage generation circuit 35b by use of the input from the first pad 11. In this case, it becomes possible to apply a voltage, for example, $V_{CC}$ voltage which is different from that in the normal operation to the memory cell capacitor plate in the burn-in operation in the wafer state. That is, a voltage stress of ($V_{CC}$-$V_{SS}$) can be applied to the capacitor insulation film by selecting all of the word lines WL and writing "0" data into all of the memory cells so as to set the storage nodes of the capacitors C of the memory cells to substantially the ground potential $V_{SS}$ and set the memory cell capacitor plates to substantially the $V_{CC}$ voltage or by writing "1" data into all of the memory cells so as to set the storage electrodes of the capacitors C to substantially the $V_{CC}$ potential and set the memory cell capacitor plates to substantially the $V_{SS}$ voltage.

That is, according to the above DRAM, in a case where a voltage stress is applied by simultaneously setting the probes of the probe card into contact with the voltage stress testing pads on the chip area of the wafer in the burn-in operation in the wafer state, not only the first circuit section but also the second circuit section can be set into the voltage stress testing mode by use of an input from a desired one of the voltage stress testing pads. As a result, since it becomes unnecessary to additionally form a voltage stress testing pad for the second circuit section, the number of voltage stress testing pads for each chip which are set in contact with the probes of the probe card in the burn-in operation in the wafer state can be reduced.

Thus, when the number of voltage stress testing pads for each chip is reduced, the following advantages can be obtained.

(a) Even when there does not exist a sufficiently large space for disposing pads on the chip, the voltage stress testing pad can be used to perform additional functions without increasing the chip size.

(b) The number of probes can be reduced with a decrease in the number of pads and the contact portion between the probes and the pads can be easily made flat. When the contact portion between the probes of the probe card and the pads is made sufficiently flat, the pads and the probes of the probe card are less likely to become damaged and the durability of the probes are less likely to become deteriorated.

(c) The number of probes can be reduced with a decrease in the number of pads and the number of chips which can be simultaneously set in contact with the probes can be increased within a range corresponding to the maximum number of probes of the probe card determined by the voltage supplying ability of the tester so that the test time can be shortened and the burn-in efficiency can be enhanced.

(d) The distance between the pads is set to be larger than the minimum pitch of the probes of the probe card and the number of chips which can be simultaneously set in contact with the probes of the probe card is increased so that the test time can be shortened and the burn-in efficiency can be enhanced.

(e) Since the limitation on the arrangement of pads can be alleviated, the pads can be arranged in such a pattern that a large number of chips can be simultaneously subjected to the burn-in process in the wafer state and the burn-in efficiency can be enhanced. An example of this is explained with reference to FIG. 2.

FIG. 2 shows the probes 23 of the probe card, and the voltage stress testing pads 11a, 12a, 11b, and 12b formed in each of the DRAM chip areas 10 of a DRAM according to a second embodiment of the invention. More precisely, this figure shows the probes 23 put in contact with the pads 11a, 12a, 11b, 12b while the DRAM is undergoing burn-in process.

The chip areas 10, which are rectangular, are on a semiconductor wafer and arranged in rows and columns. A DRAM circuit of, for example, the type shown in FIG. 1 is formed in each chip area 10. A first set of testing pads 11a and 11b, and a second set of testing pads 12a and 12b are used to achieve a voltage stress test, whereas the four pads 11, 12, 31, and 32 are used to accomplish the voltage stress test of the DRAM circuit shown in FIG. 1.

The pads 11a and 11b of the first set are connected by a wire (not shown) to perform the same function. Similarly, the pads 12a and 12b of the second set are connected by a wire (not shown) to perform the same function. The pads 11a and 12a are arranged on one shorter edge of the chip area 10, whereas the pads 11b and 12b are arranged on the opposite shorter edge of the chip area 10. The pads 11a and 11b of the first set are located in a line extending parallel to the longer edge of the chip area 10. Similarly, the pads 12a and 12b of the second set are located in a line parallel to the longer edge of the chip area 10.

As is evident from FIG. 2, the voltage stress testing pads are located densely at the shorter edges of any two adjacent chip area 10 of the same column.

Next, a method of setting the probes 23 of the probe card having an adequate construction in contact with the chip areas is explained. 24 denotes an area in which the probes 23 of the probe card may project.

Those of the probes 23 which project in the same direction from one of the two opposite side portions of the probe card are simultaneously set in contact with the voltage stress testing pads 11a, 12a, 11b, 12b which are collectively disposed on one shorter edge of a plurality of (for example, four) chip areas 10 in each of the two adjacent lines of chip area groups. Likewise, those of the probes 23 which project in the same direction from the other-side portion of the probe card are simultaneously set in contact with the voltage stress testing pads 11a, 12a, 11b, 12b which are collectively disposed on one shorter edge of four chip areas 10 in each of different two adjacent lines of chip area groups which are adjacent to the above two lines of chip area groups.

As a result, the probes 23 of the probe card can be simultaneously set in contact with the voltage stress testing pads 11a, 12a, 11b, 12b of the four chip areas in each of the adjacent four lines of chip area groups (16 chip areas in total) on the wafer and the voltage stress can be applied to the chip areas.

Further, since the probes of the probe card are set in contact with the voltage stress testing pads collectively disposed on the adjacent side portions of the adjacent chip areas, a difference in the length of the probes 23 which are set in contact with the adjacent chip areas can be reduced and the design of the probe card can be simplified.

According to the DRAM of FIG. 2, when the burn-in operation is effected by use of the probe card and prober in the wafer state, the probes of the probe card can be simultaneously set in contact with the voltage stress testing pads on a maximum permissible number of chip areas on the wafer to enhance the burn-in efficiency and improve the production capacity so that the time required for the burn-in can be reduced and the manufacturing cost can be lowered.

In the DRAM formed in the form of a finished product by dividing the wafer into individual chips and setting the chip into a package, a plurality of pads having the same function are provided as the voltage stress testing pads on the chip and the pads are separately disposed on one side portion and the other portion of the chip.

Further, in the above embodiment, the same pad as the bonding pad may be formed as the stress testing pad, but this is not limited thereto and the stress testing pad may be any type of pad if it can be set in contact with a contact pad (formed of conductive rubber, for example) of the probe card of a tester used in the burn-in process in the wafer state and it may be a bump used in the TAB (Tape Automated Bonding) technique.

In the above embodiment, the DRAM is explained as an example, but this is not limited thereto, and this invention can be applied to any type of semiconductor device having an integrated circuit formed on the chip.

Further, in the above embodiment, the voltage stress test in the burn-in process in the wafer state is explained, but this invention is also effective in a case where the voltage stress test is effected irrespective of temperature acceleration.

As described above, the embodiment described in this specification with reference to the accompanying drawings will not limit this invention. This invention can be variously modified without departing from the technical scope thereof.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory operable in a normal operation and a voltage stress test operation comprising:
   a plurality of dynamic memory cells arranged in rows and columns;
   bit lines, each bit line being connected to dynamic memory cells of a corresponding column;
   word lines, each word line being connected to dynamic memory cells of a corresponding row;
   a bit line precharge power source line for supplying a precharge voltage to said bit lines;
   a bit line precharge circuit connected between said bit line precharge power source line and said bit lines;
   a bit line precharge signal generation circuit connected to said bit line precharge circuit and controlled so as to be in one of (i) an active state in which a precharge control signal is generated for setting said bit line precharge circuit in an ON state when a control signal is input from an external portion, and (ii) an inactive state in which the precharge control signal is not generated;
   a first pad to which a stress voltage is applied from the external portion during the voltage stress test operation;
   a first switching circuit connected between said first pad and a first predetermined number of word lines, the first predetermined number of word lines being larger than a second predetermined number of word lines selected during the normal operation in accordance with a word line selecting signal, said first switching circuit transmitting the stress voltage to the first predetermined number of word lines at a time when the stress voltage is applied to said first pad; and
   a control circuit controlled by one of the stress voltage applied to said first pad and a stress test control voltage supplied to said first switching circuit, said control circuit controlling said bit line precharge signal generation circuit to be active in the voltage stress testing operation.

2. A semiconductor memory according to claim 1, further comprising a second pad, wherein:
   said first switching circuit comprises a plurality of MOS transistors having a corresponding plurality of gates; and
   said second pad is connected to each gate of the plurality of MOS transistors, the stress test control voltage being applied to said second pad from an external portion in the voltage stress test operation.

3. A semiconductor memory according to claim 1, further comprising:
   a bit line precharge voltage to be generation circuit generating a precharge voltage supplied to said bit line precharge power source line;
   a second switching circuit connected between an output terminal of said bit line precharge voltage generation circuit and said bit line precharge power source line; and
   a third switching circuit connected between said bit line precharge power source line and a ground potential node,
   wherein said control circuit controls said second switching circuit and said third switching circuit in such a manner that (i) said second switching circuit is in the ON state and said third switching circuit is in an OFF state in the normal operation, and (ii) said second switching circuit is in the OFF state and said third switching circuit is in the ON state in the voltage stress test operation.

4. A semiconductor memory according to claim 3, wherein:
   each of said plurality of dynamic memory cells includes a memory transistor having a gate insulation film; and
   said control circuit controls said second and third switching circuits so that a voltage stress is applied to each of said gate insulation films during said voltage stress test operation, the voltage stress being a difference between said stress voltage and a ground potential on said ground potential node.

5. A semiconductor memory according to claim 3, further comprising a second pad connected to said bit line precharge power source line and a third pad connected to said control circuit and supplied with a bit line potential control signal from an external portion in a die sort testing operation, wherein:
   said second pad is supplied with a desired bit line potential from the external portion in the die sort testing operation; and
   said control circuit controls said third switching circuit in such a manner that said third switching circuit is in the OFF state in the die sort testing operation, and controls said second switching circuit in such a manner that said second switching circuit is in the OFF state based on the bit line potential control signal supplied to said third pad.

6. A semiconductor memory according to claim 1, further comprising:
   a bit line precharge voltage generating circuit for generating a precharge voltage to be supplied to said bit line precharge power source line;
   a second switching circuit connected between an output terminal of said bit line precharge voltage generation circuit and said bit line precharge power source line; and
   a second pad connected to said bit line precharge power source line and supplied with a desired bit line potential from an external portion in the voltage stress test operation,
   wherein said control circuit controls said second switching circuit and in such a manner that said second switching circuits is in the ON state in the normal operation and in an OFF state in the voltage test operation.

7. A semiconductor memory according to claim 6, further comprising a third pad connected to said control circuit and supplied with a bit line potential control signal from the external portion in the die sort testing operation, wherein:
   said second pad is supplied with the desired bit line potential in the die sort testing operation; and
   said control circuit controls said second switching circuit in such a manner that said second switching circuit is in the OFF state based on the bit line potential control signal supplied to said third pad.

8. A semiconductor memory according to claim 1, further comprising:
   a bit line precharge voltage generation circuit for generating a bit line precharge voltage to be supplied to said bit line precharge power source line; and an output potential switching circuit for switching an output potential of said bit line precharge voltage generation circuit, wherein said control circuit controls said output potential switching circuit in such a manner that the normal operation and the voltage stress test operation differ in the level of the output potential of said bit line precharge voltage generation circuit.

9. A semiconductor memory according to claim 1, further comprising:

a plate potential generation circuit for generating a plate potential to be supplied to a capacitor plate of each of the dynamic memory cells; and a second switching circuit connected between an output terminal of said plate potential generation circuit and the capacitor plate, wherein said control circuit controls said second switching circuit in such a manner that said second switching circuit is in the ON state in the normal operation, and in an OFF state in the voltage stress test operation.

10. A semiconductor memory according to claim 9, wherein:

said capacitor further includes a storage node and a capacitor insulation film disposed between the storage node and the capacitor plate;

said control circuit controls precharge of said bit lines during said voltage stress test operation to apply said precharge voltage to said storage node of said capacitor as a node voltage;

said control circuit further controls said plate potential generation circuit and said second switching circuit so that a voltage stress is applied to said capacitor insulation film, and said voltage stress applied to said capacitor insulation film is a difference between said plate potential and said node voltage.

* * * * *